United States Patent [19]
Kubota et al.

[11] Patent Number: 5,928,528
[45] Date of Patent: Jul. 27, 1999

[54] PLASMA TREATMENT METHOD AND PLASMA TREATMENT SYSTEM

[75] Inventors: Masafumi Kubota, Takatsuki; Shigenori Hayashi, Gose; Michinari Yamanaka, Hirakata; Kenji Harafuji, Shijonawate, all of Japan

[73] Assignee: Matsushita Electric Industrial Co., Ltd., Osaka, Japan

[21] Appl. No.: 08/921,896

[22] Filed: Sep. 2, 1997

[30] Foreign Application Priority Data

Sep. 3, 1996 [JP] Japan .................................. 8-232987

[51] Int. Cl.$^6$ ........................................................ H05H 1/16
[52] U.S. Cl. ................ 216/67; 216/61; 427/569; 118/708; 118/723 E
[58] Field of Search ................ 216/59, 61, 67, 216/68, 71; 438/14; 118/712, 723 R, 723 E, 723 ER; 204/298.03, 298.32; 156/345

[56] References Cited

U.S. PATENT DOCUMENTS

| | | | |
|---|---|---|---|
| 4,464,223 | 8/1984 | Gorin | 438/729 |
| 5,013,578 | 5/1991 | Brown et al. | 427/455 |
| 5,102,687 | 4/1992 | Pelletier et al. | 427/576 |
| 5,242,561 | 9/1993 | Sato | 204/192.33 |
| 5,310,452 | 5/1994 | Doki et al. | 438/728 |
| 5,435,886 | 7/1995 | Fujiwara et al. | 438/710 |
| 5,558,718 | 9/1996 | Leung | 118/723 E |
| 5,630,880 | 5/1997 | Eastlund | 118/723 MP |
| 5,651,865 | 7/1997 | Sellers | 204/192.13 |
| 5,683,538 | 11/1997 | O'Neill et al. | 156/345 |
| 5,779,925 | 7/1998 | Hashimoto et al. | 216/67 |

*Primary Examiner*—Bruce Breneman
*Assistant Examiner*—Allan Olsen
*Attorney, Agent, or Firm*—Pearne, Gordon, McCoy & Granger LLP

[57] ABSTRACT

A reactive gas supplied to a chamber 1 is put into plasma by supplying radio frequency power to the chamber 1 intermittently or while repeating high and low levels alternately and a specimen A in the chamber 1 is treated by the plasma. A positive pulse-like bias voltage synchronized with a period in which the radio frequency power is not supplied or a period in which low-level power is supplied is applied to the specimen A for preventing charging.

22 Claims, 8 Drawing Sheets

RADIO FREQUENCY
POWER PULSE

→ TIME

←Td→

BIAS DC
VOLTAGE PULSE

→ TIME

ELECTRON
DENSITY

→ TIME

NEGATIVE ION
DENSITY

→ TIME

POSITIVE ION
DENSITY

I+

→ TIME

NEGATIVE ION CURRENT I-

ELECTRON CURRENT Ie

I-

→ TIME

NEGATIVE ION   ELECTRON
CURRENT I-     CURRENT Ie

PLASMA TREATMENT METHOD AND PLASMA TREATMENT SYSTEM

BACKGROUND OF THE INVENTION

This invention relates to a plasma treatment method and a plasma treatment system using high-frequency discharge.

In semiconductor manufacturing, the plasma treatment method using high-frequency discharge is used in various fields of dry etching for microfabrication, sputtering for thin film formation, plasma CVD, etc.

The dry etching appropriate for microfabrication will be discussed as an application example of the plasma treatment method.

The dry etching is a fabrication technique using a chemical or physical reaction between vapor phase and solid phase surface caused by radicals, ions, etc., existing in plasma to remove an unnecessary portion of a specimen, such as a thin film or a substrate.

Reactive ion etching (RIE) used most widely as the dry etching technique is to expose a specimen to high-frequency discharge plasma of proper gas, thereby causing an etching reaction for removing an unnecessary portion of the surface of the specimen. The necessary portion of the specimen, namely, the unremoved portion normally is protected by a photoresist pattern used as a mask.

Orientation of ions needs to be established to promote microminiaturization in the reactive ion etching. To do this, it is indispensible to reduce scattering of ions in plasma. To establish alignment of ions, it is effective to lower pressure in a plasma generator and enlarge an average free path of ions. However, if the pressure in the plasma generator is lowered, the radical density lowers and the etching speed slows down.

As countermeasures against the problem, high-density plasma systems such as an inductively coupled plasma system and a Helicon plasma system are introduced. The high-density plasma system can generate plasma at 10–100 times higher density as compared with a conventional parallel plate RIE system and can provide etching speed equal to or more than that of the parallel plate RIE system even under a condition wherein pressure is lower $\frac{1}{10}$–$\frac{1}{100}$.

However, it became evident that problems such as 1) abnormal etching profile; 2) occurrence of microloading effect; and 3) occurrence of degradation or destruction of gate insulating film occur in the conventional plasma treatment method thus improved. This topic will be discussed in detail.

In the conventional plasma treatment method, the specimen treated with plasma is negatively biased due to self-bias. Such self-bias is caused by the fact that the specimen is negatively charged on average as time by radio frequency power (RF) applied to the specimen stage.

In the conventional plasma treatment method wherein the specimen is thus biased negatively, the surface of the specimen is charged up by positive ions and electrons incident on the specimen.

When the specimen is charged up, the etching profile becomes abnormal. For example, when etching a polycrystalline silicon substrate by plasma treatment and the specimen is charged as described above, the pattern side wall becomes negatively charged and the pattern bottom surface becomes positively charged. If such potential difference imbalance occurs, the incidence angle of positive ions on each line pattern scatters and the profile of the pattern sidewall does not become abrupt and becomes tapering, so that an abnormal etching form occurs.

Further, for example, considering similar etching to that described above, a line pattern adjoins the inner side face of the outermost line pattern in a plane view, but no line pattern adjoins the outer side face of the outermost line pattern. Because of such an uneven form, on the outermost line pattern, the charge amount becomes uneven inside and outside the pattern (a region where no pattern exists is defined as outside and a region where patterns exist continuously is defined as inside). Resultantly, the charge-up amount inside the pattern differs from that outside the pattern, causing a potential difference to occur. The incident ion amount varies because of the potential difference and wedge-like holes, generally called notches, are made in the inner side face of the pattern on which more ions are incident. This fact is also described in K. K Chi and others, DRY PROCESS SYMPOSIUM Yokoushuu, p.75, Denki gakkai 1995, for example.

Such localization and unevenness of ions also affect the etching speed itself. That is, a photo resist mask is positively charged because of incident positive ions during etching. Thus, the smaller (narrower) the mask opening, the stronger the incidence inhibition function of positive ions on the opening. Resultantly, the microloading effect of a phenomenon in which the smaller (narrower) the mask opening, the slower the etching speed is caused.

Further, to manufacture MOS devices using the conventional plasma treatment method causing such an uneven charge supply, gate insulating films are degraded and destroyed. That is, for example, to manufacture a MOS device having a gate insulating film of a very thin film about 10 nm or less thick, if an uneven charge supply is caused by the conventional plasma treatment method, the mutual conductance of the MOS device exposed to plasma is degraded, leading to electric breakdown in an extreme case. This fact is also described in ERIGUCHI and others, IEICE TRANCE. ELECTRON., VOL. B78-C261, the Institute of Electronics, Information and Communication Engineers, for example.

By the way, if the transistor size becomes 1 micron or less by microminiaturization, an LSI contains semiconductor devices having a so-called antenna structure where the wiring area is $10^3$ or $10^4$ times larger than the transistor area.

Since such an antenna structure promotes the above-described charge unevenness, degradation and destruction of gate insulating films caused by plasma together with microminiaturization may become important problems increasingly.

In addition, if the plasma density is raised by introducing the high density plasma system such as an inductively coupled plasma system or a Helicon plasma system, the charge-up amount also increases. Thus, such a problem must become more serious.

As one method for solving such a problem, pulse plasma process has been proposed (for example, Ohtake and others, DRY PROCESS SYMPOSIUM Yokoushuu, p.45, Denki gakkai 1995).

The pulse plasma process is to supply plasma generating radio frequency power (RF) like pulses and the existence of an off period in the radio frequency power supply moderates local charge accumulation. According to the method, electrons are decreased and negative ions occur in the off period of the radio frequency power supply, which also enhances charge distribution uniformity.

However, the pulse plasma process cannot sufficiently solve the problem of an uneven charge supply. That is, to use generated positive and negative ions to perform the etching operation in the example of Ohtake and others, a bias voltage at a frequency 600 kHz or less not causing a self-bias needs to be applied to a sample state on which a specimen is placed. However, if an AC bias voltage is applied to the specimen stage and plasma treatment (etching treatment) is executed even at such a low frequency, energy of ions flowing into the specimen becomes too large and the etching selectivity between the photo resist and the silicon substrate becomes only about 2; it is insufficient for highly accurate etching.

SUMMARY OF THE INVENTION

It is therefore an object of the invention to provide a plasma treatment method and a plasma treatment system excellent in microworkability even under low pressure and hard to cause damage to devices.

To the end, according to the invention, there is provided a plasma treatment method comprising the steps of putting a reactive gas supplied to a vacuum chamber into plasma by supplying radio frequency power to the vacuum chamber intermittently or while repeating high and low levels alternately and working a specimen in the vacuum chamber by the plasma, wherein a positive pulse-like bias voltage synchronized with a period in which the radio frequency power is not supplied or a period in which low-level power is supplied is applied to the specimen.

According to the invention, there is provided a plasma treatment system comprising a vacuum chamber in which a specimen is placed, reactive gas supply means for supplying a reactive gas to the vacuum chamber, plasma generating power supply means for supplying radio frequency power to the vacuum chamber intermittently or while repeating high and low levels alternately, and bias voltage supply means for applying to the specimen a positive pulse-like bias voltage synchronized with a period in which the radio frequency power is not supplied or a period in which low-level power is supplied.

In the plasma treatment method and the plasma treatment system of the invention, a reactive gas supplied to the vacuum chamber is put into plasma by supplying radio frequency power to the vacuum chamber intermittently or while repeating high and low levels alternately and a specimen in the vacuum chamber is worked by the plasma, wherein a pulse-like bias voltage which goes positive in synchronization with a period in which the radio frequency power is not supplied or a period in which low-level power is supplied is applied to the specimen. Preferably, the pulse-like bias voltage is applied to the specimen via a specimen stage. Such a configuration is provided, thereby producing the following effects:

When the positive pulse-like bias voltage is applied, negative ions and electrons are implanted into the specimen surface in attraction to the positive bias voltage. Thus, potential difference imbalance wherein the pattern side wall is charged negatively and the bottom face is charged positively can be resolved. Since the impingement of negative ions to the specimen surface increases, the etching speed is accelerated. Further, in general etching plasma containing an electron negative gas, plasma generating power is supplied as radio frequency pulses, whereby an afterglow state is entered while the radio frequency pulse is off, and electrons are consumed in large quantity because of electron dissociative attachment. In addition, high-density negative ions are formed instead of consumed electrons. Thus, negative ions can be complementarily introduced to the specimen surface aggressively and charge caused by positive ions can be furthermore canceled.

If the bias voltage is always applied to the specimen or synchronization is not established between the period in which the radio frequency power is not supplied or the period in which low-level power is supplied and the period in which the pulse-like bias voltage is positive, positive pulse voltage is applied to the specimen while high-density electrons exist in plasma. This causes the disadvantages in that while high-density electrons exist in plasma, positive pulse voltage is applied to the specimen; a large amount of electron current flows into the specimen and the power dissipation at the bias power supply becomes extremely large; and that negative ions are not sufficiently taken in and the local charge accumulation cannot sufficient be canceled.

In the invention, however, the period in which the radio frequency power is not supplied or the period in which low-level power is supplied is synchronized with the period in which the pulse-like bias voltage is positive, so that application of the positive pulse voltage to the specimen while high-density electrons exist in plasma does not occur. Therefore, the disadvantages as described above do not occur.

The pulse-like bias voltage goes positive in synchronization with the period in which the radio frequency power is not supplied or the period in which low-level power is supplied, so that the period for canceling local charge accumulation in which the pulse-like bias voltage goes positive is shortened and energy of ions flowing into the specimen lessens.

Further, in the plasma treatment method and the plasma treatment system of the invention, the pulse-like bias voltage is applied after the expiration of a predetermined time interval from the end time of the period in which the radio frequency power is supplied or the period in which high-level power is supplied. Thus, the following effects are produced: The electron density in plasma becomes sufficiently low before the positive pulse voltage is applied, thus the electron current supply amount to the specimen is furthermore decreased and the power dissipation of the bias power supply furthermore lessens. In addition, taking in negative ions is promoted and locally accumulated charge is furthermore canceled.

Further, in the plasma treatment method and the plasma treatment system of the invention, the predetermined time interval is a period between the end time of the period in which the radio frequency power is supplied or the period in which high-level power is supplied and the instant at which the electron density in the vacuum chamber reaching the maximum level as the radio frequency power is applied becomes less than a half of the maximum level. Thus, the following effects are produced: The electron density in the plasma when the positive pulse voltage is supplied furthermore lowers; the effects of a decrease in the electron current supply amount to the specimen, a decrease in the load of the bias power supply, and promotion of charge cancel become more remarkable.

Further, in the plasma treatment method and the plasma treatment system of the invention, pulse voltage repeating positive and negative periods alternately may be used as the pulse-like bias voltage. In this case, a period in which the pulse-like bias voltage is negative is provided between periods in which the pulse-like bias voltage is positive, whereby energy of positive ions taken in the specimen grows.

DESCRIPTION OF THE PREFERRED EMBODIMENTS

Referring now to the accompanying drawings, there are shown preferred embodiments of the invention.

Figure 1:
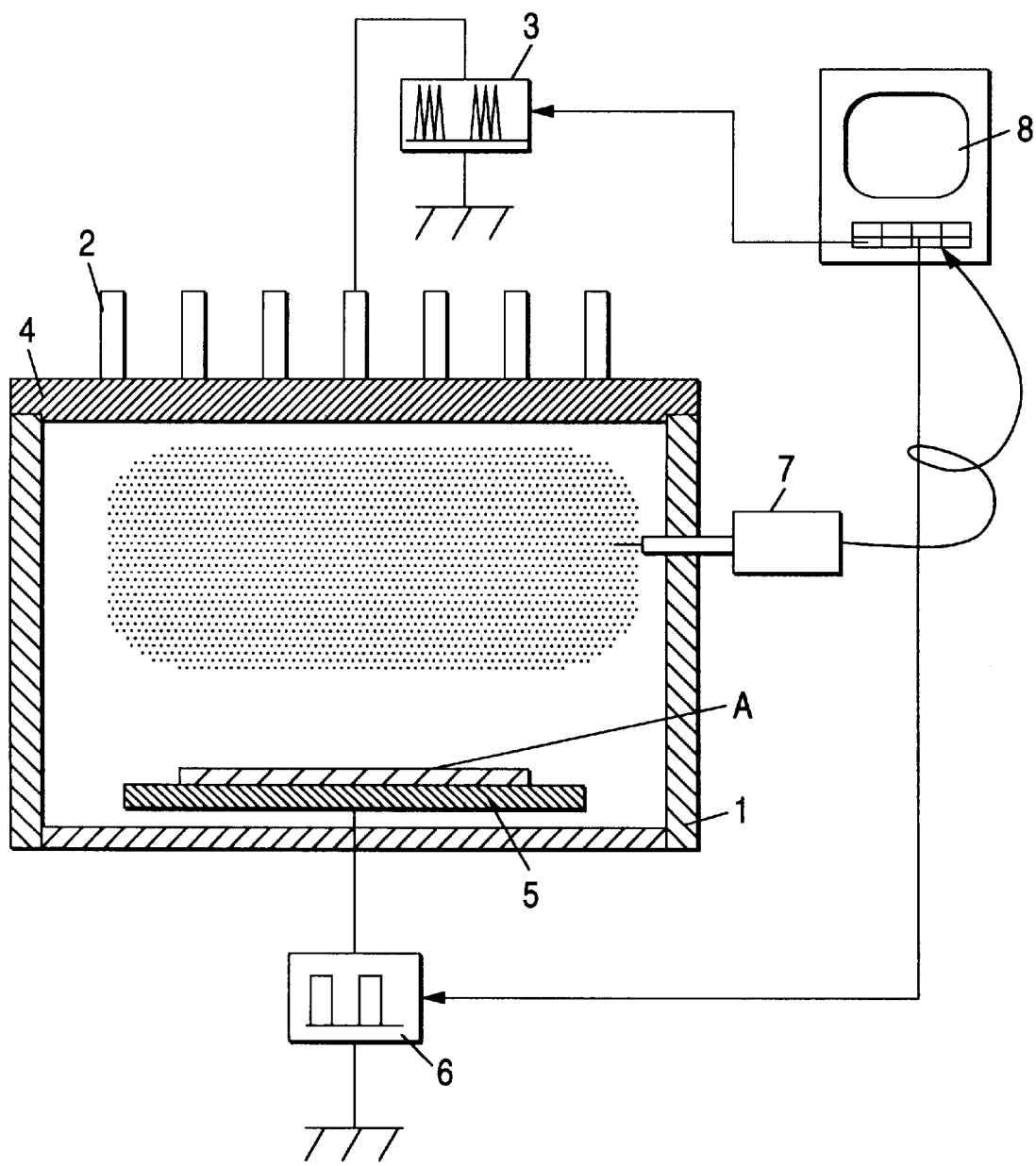
FIG. 1 is a schematic diagram to show the configuration of a dry etching system of a first embodiment of the invention.

First embodiment:

FIG 1 is a schematic diagram to show the configuration of a dry etching system of a first embodiment of the invention. The dry etching system comprises a chamber with inner walls covered with insulating material of ceramic, teflon, quartz, or the like. The chamber 1 is grounded. It comprises spiral electrodes 2 to which radio frequency power of pulses is applied. The spiral electrodes 2 are connected to a plasma generating radio frequency pulse power supply 3 for generating plasma inside the chamber 1 via a dielectric plate 4 made of ceramic, etc. An induction field causes plasma to occur in the chamber 1. The chamber 1 may be of a double structure having an inner chamber made of quartz, etc. It contains a specimen stage 5 on which an etched specimen A is placed. For example, the specimen stage 5 is made of a metal material coated on a surface with an insulating material. A bias DC pulse power supply 6 is connected to the specimen stage 5.

A probe 7 is inserted into the chamber 1 from the side face thereof. The probe 7 collects various pieces of data of plasma generated in the chamber 1, such as electron density, and transfers the data to a plasma controller 8. To prevent plasma from causing the probe 7 to be degraded, a structure may be adopted wherein the probe 7 is inserted into the chamber 1 only at the measurement time. Plasma data may also be collected with an interferometer using microwaves in place of the probe 7. In doing so, plasma data at a desired time can be collected without being concerned about degradation of the probe 7.

Figure 2:
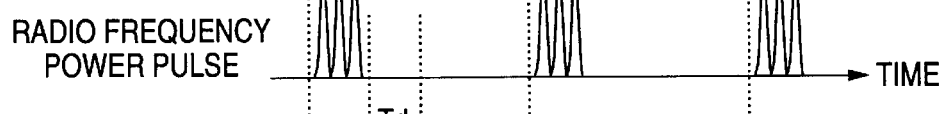
FIG. 2 is a schematic diagram to show time change of various parameters in the first embodiment of the invention.
Figure 2:
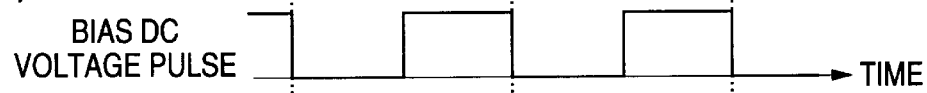
Figure 2:
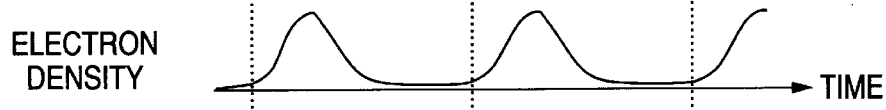
Figure 2:
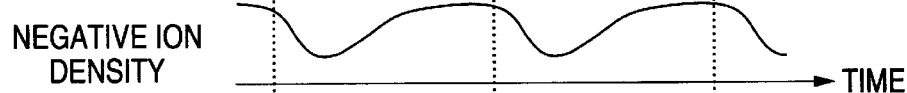
Figure 2:
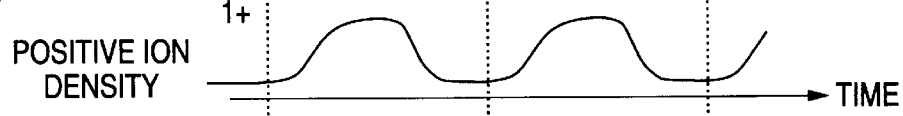
Figure 2:
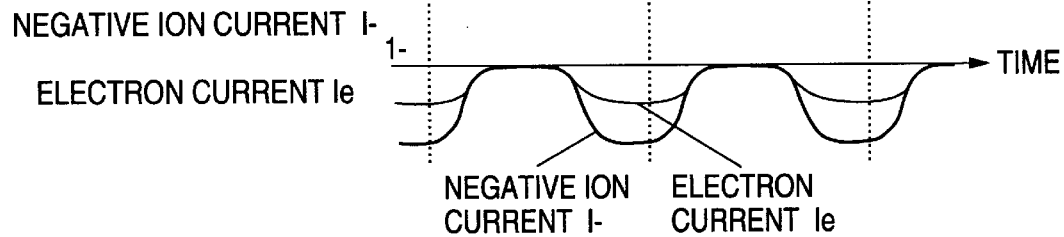
Figure 3:
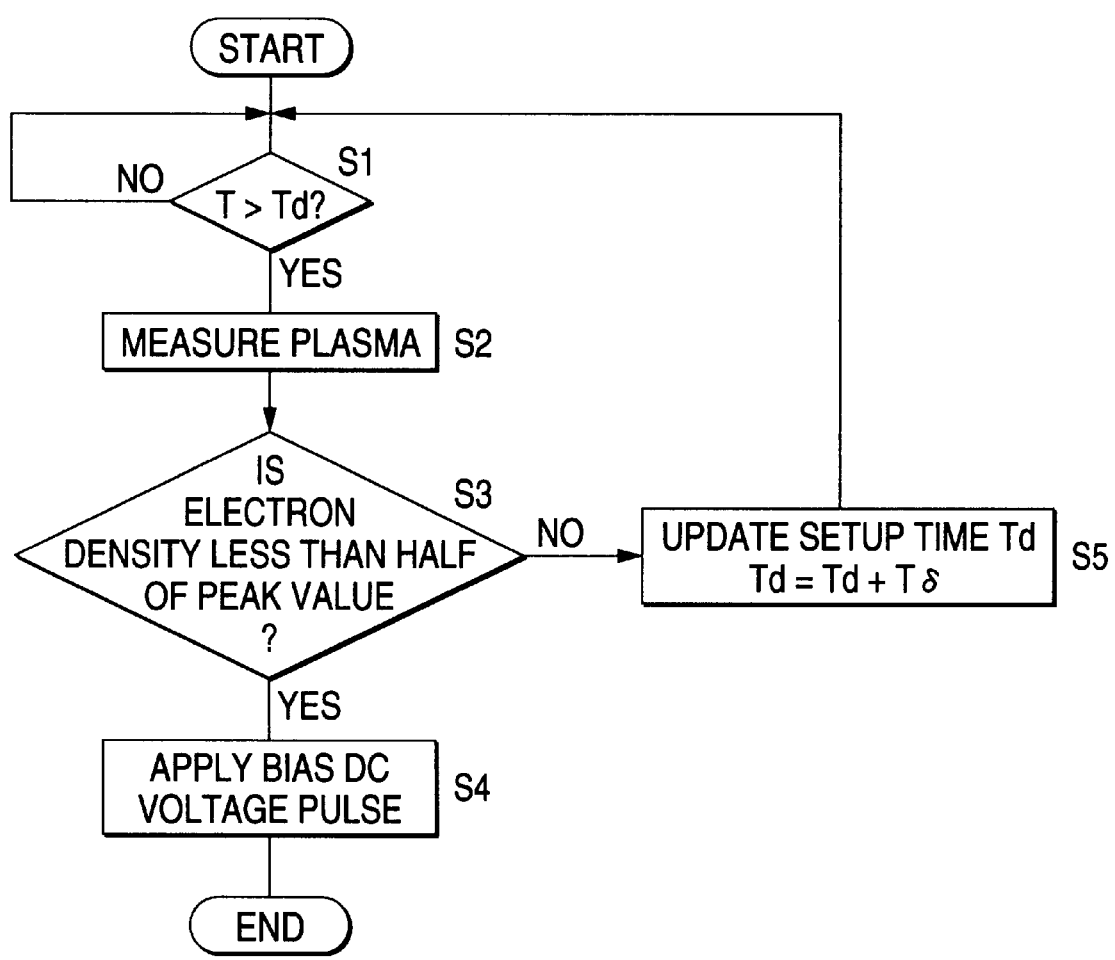
FIG. 3 is a flowchart of the operation of the dry etching system of the first embodiment of the invention.

Next, an etching process of the specimen A using the etching system will be discussed based on a timing chart in FIG. 2 and a flowchart in FIG. 3. FIG. 2 is a timing chart of time change of various parameters in the dry etching system.

First, pressure in the chamber 1 is reduced to 1–3 Pa and a 50-sccm chlorine gas and a 25-sccm HBr gas as reactive gases are introduced into the chamber 1 in which pressure is thus reduced. On the other hand, the plasma generating radio frequency pulse power supply 3 applies radio frequency power pulses shown in FIG. 2(a) to the chamber 1 via the spiral electrode 2 and the dielectric plate 4. For example, radio frequency power pulses of basic frequency 13.56 MHz, pulse width 10–30 $\mu$sec, 10 KHz in terms of pulse repetition frequency, and power 500–1000 W are used as the radio frequency power pulses.

The elapsed time T since the radio frequency power pulses were turned off is measured and the measured elapsed time T is compared with a previously setup value Td at step S1. The initial setup value Td is 30–70 $\mu$sec. If the elapsed time T exceeds the setup value Td (T>Td), the electron density of plasma in the chamber 1 is measured by the probe 7 and is transmitted to the plasma controller 8 at step S2.

The plasma controller 8 performs the following control based on the transmitted plasma data: it previously measures and stores the peak value of the electron density in the chamber 1 by the probe 7, then compares the peak value with the measured electron density at step S3.

If the comparison result at step S3 is "measured electron density<peak value×½," it is determined that the electron density sufficiently lowers, and a positive bias DC voltage pulse is applied to the specimen stage 5 at step S4.

At this time, proper voltage of the positive bias DC voltage pulse applied to the specimen stage 5 is 50–200 V, because if the bias voltage pulse voltage is set to more than 200 V, the sputtering effect rises and the etch rate selectivity between the specimen A and photoresist lessens. The pulse width of the bias voltage pulse is increased or decreased under the control described later; it becomes 0.1–10 $\mu$sec.

On the other hand, if the comparison result at step S3 is "measured electron density's peak value×½," it is not determined that the electron density sufficiently lowers, and the setup value Td is again set at step S5 by adding a given extension time T$\delta$ to the setup value Td (Td=Td+T$\delta$).

After the setup value Td is again set at step S5, control returns to step S1 and the elapsed time T is compared with the updated setup value Td.

In the description, the threshold value for determining that the density value sufficiently lowers at step S3 is "electron density peak×½." However, preferably the threshold value is set to "measured electron density<electron density peak× ¹⁄₁₀" to enhance the accuracy determining that the electron density lowers.

The positive bias DC voltage pulse is thus applied to the specimen A via the specimen stage 5. Since the reactive gas (halogen gas) supplied to the chamber 1 is electron negative gas, the electron acceleration mechanism disappears in the so-called afterglow plasma state after the plasma generating radio frequency pulse power supply 3 is turned off. Thus, the electron temperature in the chamber 1 lowers, electron dissociative attachment easily occurs, and the electron density lowers rapidly (see FIG. 2(c)).

Although the electron density in the chamber 1 lowers, negative ions increase abruptly (see FIG. 2(d)). Since the positive bias DC voltage pulse is applied to the specimen A, the positive ion current in the chamber 1 in the afterglow plasma state lowers abruptly (see FIG. 2(e)).

The electron density is sufficiently low and the negative ion density is large in the afterglow plasma state. Thus, when the bias DC pulse power supply 6 applies positive voltage to the specimen A, the electron current flowing into the specimen A is sufficiently small and negative ion current can be extracted efficiently and can be applied to the specimen A (see FIG. 2(f)).

The specimen A is etched as described above. The inventor etched phosphorus-doped polycrystalline silicon as the specimen A by the etching system under the above-described etching conditions. Good results of etch rate 300–800 nm/sec and the selectivity to oxide film of 20–100 were obtained. The etching profile was anisotropic. Further, when a DC voltage pulse having a pulse width of 0.1 $\mu$sec or more was applied to the chamber 1 by the bias DC pulse power supply 6, notches, abnormal profile, etc., caused by charging was not found.

The possible reasons for lessening charging in the method of the invention include small electron density in addition to contribution of nature of negative ions. That is, when positive and negative ions of high energy are incident on the specimen A, incident ion charge is accumulated on the surface of the specimen A; in addition, the effect of secondary electrons emitted from the surface of the specimen A with incidence of the ions cannot be ignored. When positive ions are incident on the specimen A, the secondary electrons are emitted so as to increase accumulation of the positive charge, but when negative ions are incident, emission of the secondary electrons counteracts accumulation of the negative charge. Thus, the charging phenomenon is suppressed.

Further, in the dry etching system, the DC voltage pulse serving as bias is turned on in synchronization with the off period of the radio frequency power pulse, so that the period in which bias goes positive is shortened, and energy of ions flowing into the specimen A lessens. Thus, the etch selectivity of the specimen A can be made sufficiently large.

Figure 4:
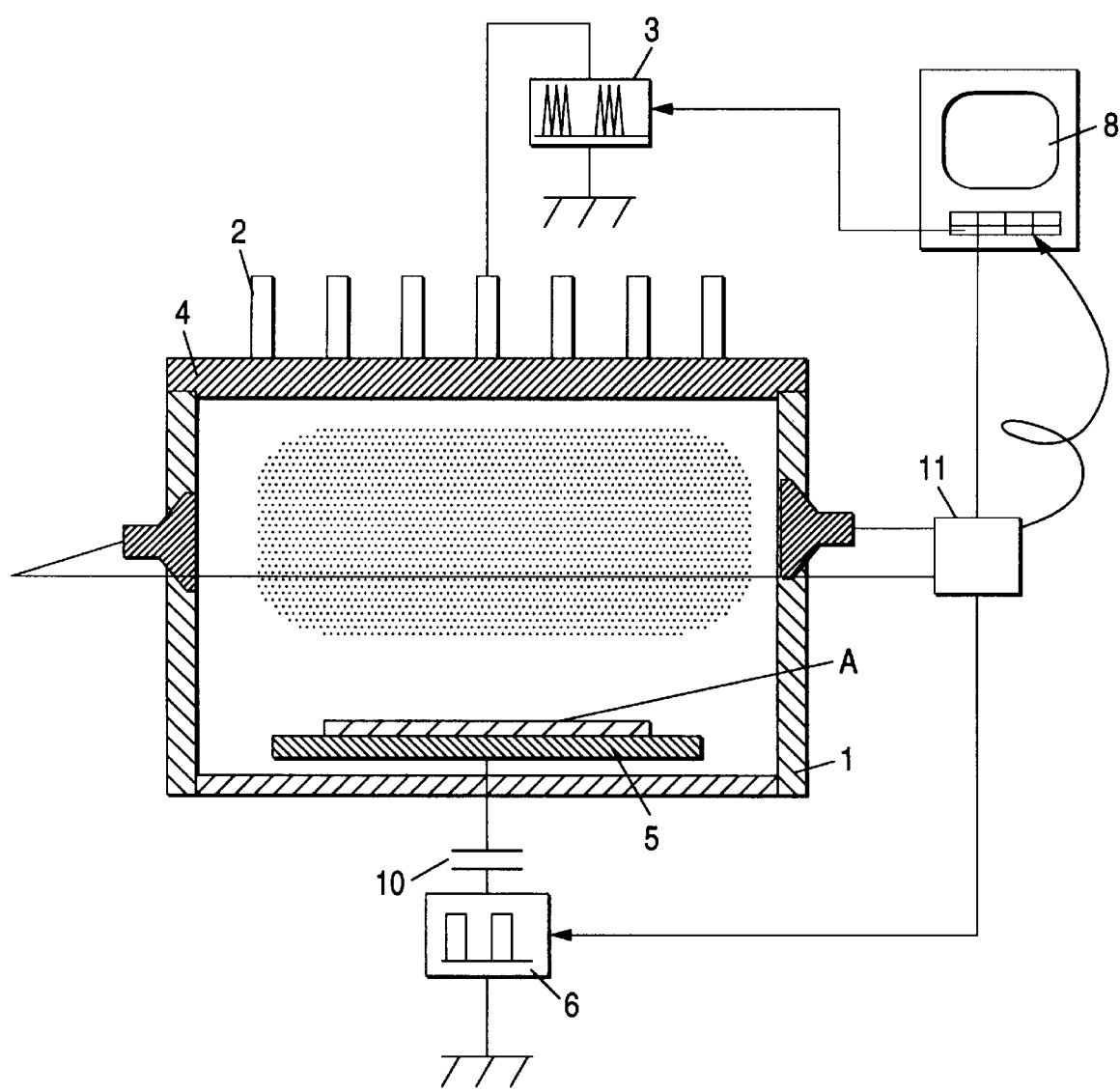
FIG. 4 is a schematic diagram to show the configuration of a dry etching system of a second embodiment of the invention.

Second embodiment:

FIG. 4 is a schematic diagram to show the configuration of a dry etching system of a second embodiment of the invention. Parts identical with or similar to those previously described with reference to FIG. 1 are denoted by the same reference numerals in FIG. 4. The dry etching system of the second embodiment differs from that of the first embodiment in that a capacitive circuit 10 is inserted between a specimen stage 5 and a bias DC pulse power supply 6 and that an electron density detector 11 using microwaves is provided.

Since the total amount of charges flowing into the specimen stage 5 can be reduced to zero by providing the capacitive circuit 10, no current penetrates the bias DC pulse power supply 6, so that the power supply capacity of the bias DC pulse power supply 6 can be made small. When the capacitive circuit 10 is provided, control needs to be performed so that the pulse width of a bias DC voltage pulse is not made too wide, because if the pulse width becomes too wide, the positive voltage of the bias DC voltage pulse does not sufficiently rise.

Figure 5:
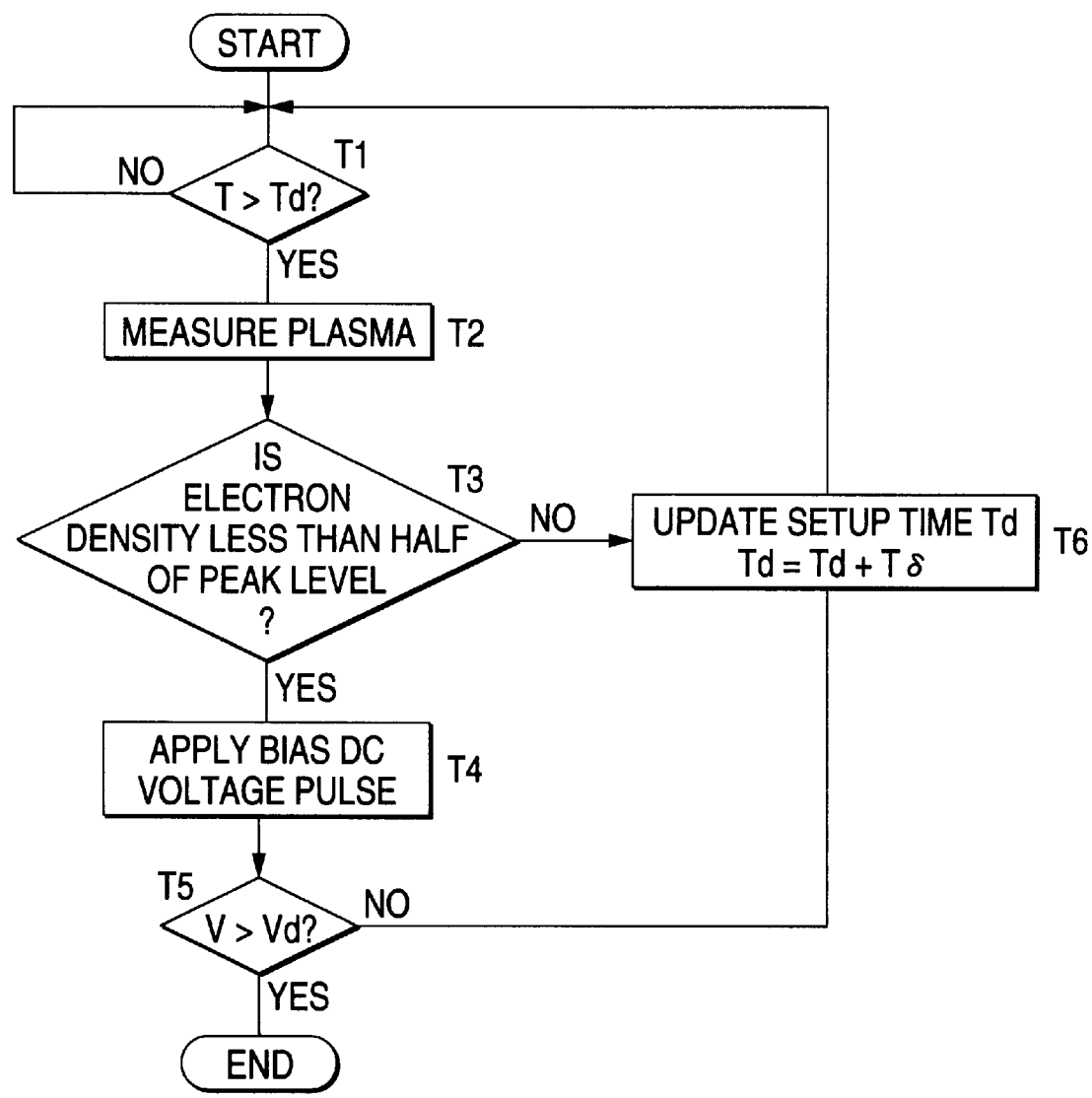
FIG. 5 is a flowchart of the operation of the dry etching system of the second embodiment of the invention.

Next, an etching process of a specimen A using the dry etching system will be discussed based on a flowchart in FIG. 5.

First, pressure in a chamber 1 is reduced to 3–10 Pa and a 50-sccm $C_4F_8$ gas as a reactive gas is introduced into the chamber 1 in which pressure is thus reduced. On the other hand, a plasma generating radio frequency pulse power supply 3 applies radio frequency power pulses shown in FIG. 2(a) to the chamber 1 via spiral electrode 2 and a dielectric plate 4. For example, radio frequency power pulses of basic frequency 27.12 MHz, pulse width 10–50 $\mu$sec, 5–10 KHz in pulse repetition frequency, and power 500–1500 W are used as the radio frequency power pulses.

The elapsed time T since the radio frequency power pulses were turned off is measured and the measured elapsed time T is compared with a previously setup value Td at step T1. The initial setup value Td is 30–70 $\mu$sec. If the elapsed time T exceeds the setup value Td (T<Td), the electron density of plasma in the chamber 1 is measured through the electron density detector 11 and is transmitted to a plasma controller 8 at step T2.

The plasma controller 8 performs the following control based on the transmitted plasma data: It previously measures and stores the peak value of the electron density in the chamber 1 through the electron density detector 11, then compares the peak value with the measured electron density at step T3. If the comparison result at step T3 is "measured electron density<peak value×½," it is determined that the electron density sufficiently lowers, and a positive bias DC voltage pulse is applied to the specimen stage 5 at step T4.

After the bias DC voltage pulse is applied to the specimen stage 5, whether or not voltage value V of the bias DC voltage pulse applied to the specimen stage 5 exceeds lower limit value Vd is determined at step T5.

The reason why the determination is made at step T5 is that if the pulse width of the bias DC voltage pulse is made too wide, the positive voltage of the bias DC voltage pulse does not sufficiently rise in the dry etching system provided with the capacitive circuit 10, as described above. Since a proper voltage setup value of the bias DC voltage pulse is 50–200 V, the lower limit value Vd is set with the setup value as reference and is previously stored in the plasma controller 8.

If the voltage value V of the bias DC voltage pulse does not exceed the lower limit value Vd (V>VD) at step T5, the setup value Td is again set at step T6 by adding a given extension time Tδ to the setup value Td (Td–Td+Tδ). After the setup value Td is again set at step T6, control returns to step T1 and the elapsed time T is compared with the updated setup value Td. The setup value Td is extended by again setting the setup value Td. Resultantly, the voltage value of the bias DC voltage pulse rises.

Likewise, if the comparison result at step T3 is "measured electron density≧peak value×½," it is not determined that the electron density sufficiently lowers, and control goes to step T6 at which the setup value Td is again set.

Also in the embodiment, the threshold value for determining that the density value sufficiently lowers at step T3 is "electron density peak×½." However, preferably the threshold value is set to "measured electron density<peak× ¹⁄₁₀" to enhance the accuracy determining that the electron density lowers.

The operation after the positive bias DC voltage pulse is applied to the specimen A via the specimen stage 5 and the effects produced on the specimen A are similar to those previously described in the first embodiment and therefore will not be discussed again.

The specimen A is etched as described above. The inventor etched a BPSG (boron phosphorus glass) film by using the dry etching system of the second embodiment under the etching conditions similar to those described above. Good results of etch rate 500–1000 nm/sec and selectivity to silicon of 50 or more were obtained. The etching profile was anisotropic. In the dry etching system of the embodiment, particularly the etch rate aspect ratio (depth/opening width ratio) dependency is small and if the etching speed on a pattern with aspect ratio 0.1 is 1, 90% or more etching speed is provided even at aspect ratio 10.

Figure 6:
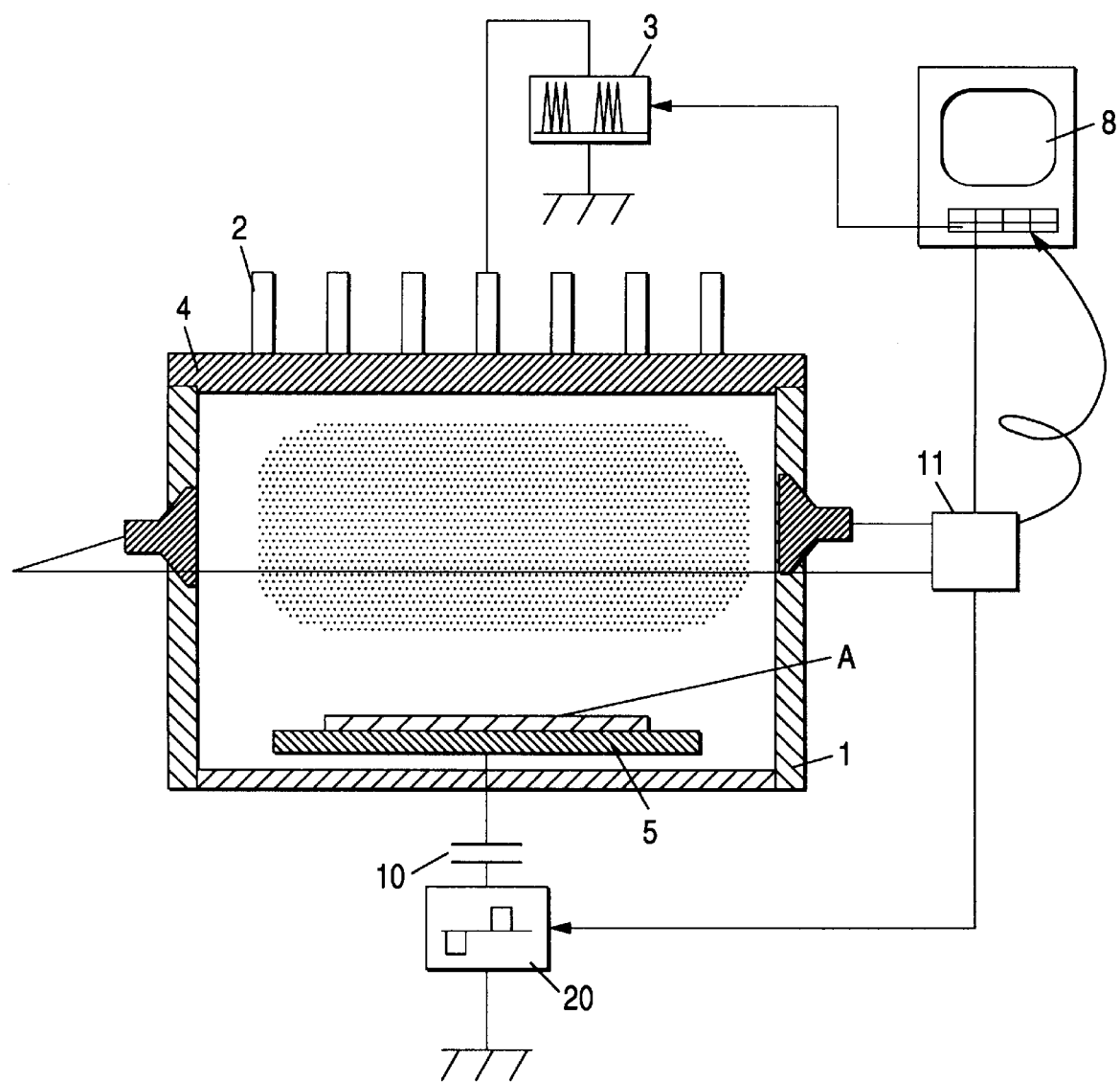
FIG. 6 is a schematic diagram to show the configuration of a dry etching system of a third embodiment of the invention.
Figure 7:
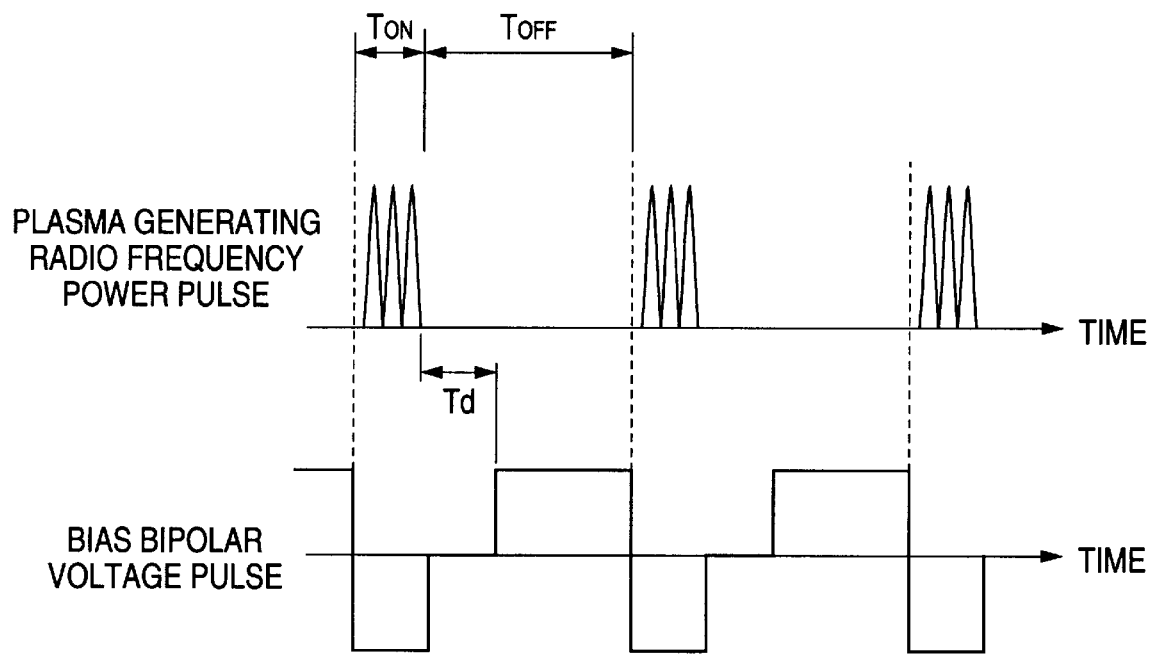
FIG. 7 is a chart to explain the timing of applying pulse-like bias voltage in the dry etching system of the third embodiment of the invention.

Third embodiment:

FIG. 6 is a schematic diagram to show the configuration of a dry etching system of a third embodiment of the invention. Parts identical with or similar to those previously described with reference to FIG. 4 are denoted by the same reference numerals in FIG. 6. The dry etching system of the third embodiment differs from that of the second embodiment in that it comprises a bias bipolar pulse power supply 20. The bipolar pulse power supply 20 applies a bias voltage as shown in FIG. 7 to a specimen stage 5. That is, it applies to the specimen stage 5, bipolar voltage pulses which become positive voltage in synchronization with period $T_{OFF}$ in which a plasma generating radio frequency pulse power supply 3 is off and become negative voltage duplicately with period $T_{ON}$ in which the plasma generating radio frequency pulse power supply 3 is on. In this case, the period in which the bipolar voltage pulse is negative need not be synchronized so as to become the same as the period $T_{ON}$ in which the plasma generating radio frequency pulse power supply 3 is on; it may be a little short or long or may be delayed slightly. In summary, positive ions may be drawn out into the specimen A on the specimen stage 5 in high energy according to the period in which the bipolar voltage is negative. Such bipolar voltage pulse setting and generation timing control is effective particularly when high-energy etching is required as an oxide film is etched.

The dry etching system of the embodiment was used to etch a BPSG (boron phosphorus glass) film under the following conditions:

Pressure in a chamber 1 is reduced to 3–10 Pa;

a 50-sccm $C_4F_8$ gas is introduced into the chamber 1;

radio frequency power pulse applied from the plasma generating radio frequency pulse power supply 3 to the chamber 1 is frequency 27.12 MHz, pulse width 10–50 $\mu$sec, and power 500–1500 W; and bipolar voltage pulse applied from the bias bipolar pulse power supply 20 to the specimen stage 5 is ±100–500 V voltage, pulse width 0.1–5 $\mu$sec, frequency 5–10 kHz, and setup time (the time between the instant at which the radio frequency power pulse is turned off and the instant at which the bipolar voltage pulse is turned on) Td 30–70 $\mu$sec.

The above-described BPSG film was etched under these conditions. The etch rate was drastically improved to 500–1300 nm/sec and good selectivity to silicon of 50 or more was also provided. The etching profile was anisotropic.

Figure 8:
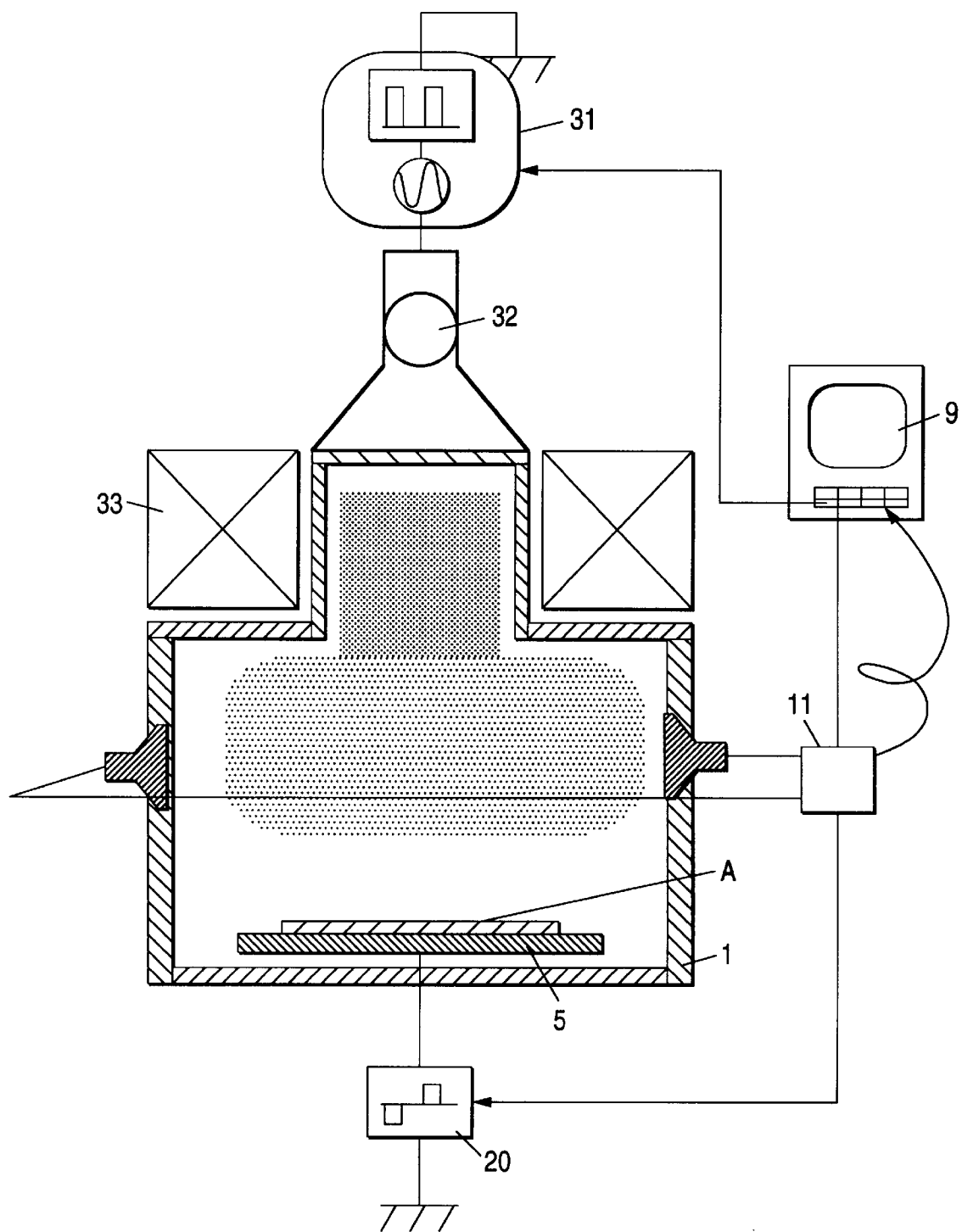
FIG. 8 is a schematic diagram to show the configuration of a dry etching system of a fourth embodiment of the invention.

Fourth embodiment:

FIG. 8 is a schematic diagram to show the configuration of a dry etching system of a fourth embodiment of the invention. Parts identical with or similar to those previously described with reference to FIG. 6 are denoted by the same reference numerals in FIG. 8. The dry etching system of the fourth embodiment differs from that of the third embodiment in that a plasma source is ECR (electron cyclotron resonance) plasma. Thus, the dry etching system comprises a pulse microwave power supply 31, a mode converter 32, and a coil 33.

The dry etching system of the embodiment was used to etch a BPSG (boron phosphorus glass) film under the following conditions:

Pressure in a chamber 1 is reduced to 1–5 Pa;

a 50-sccm $C_2F_6$ gas is introduced into the chamber 1;

$\mu$wave power pulse applied from the pulse $\mu$wave power supply 31 to the chamber 1 is basic frequency 2.45 GHz, pulse repetition frequency 5–10 kHz, and pulse width 10–50 $\mu$sec; and bipolar voltage pulse applied from a bias bipolar pulse power supply 20 to a specimen stage 5 is ±100–500 V voltage, pulse width 0.1–5 $\mu$sec, frequency 5–10 kHz, and setup time (the time between the instant at which the $\mu$wave power pulse is turned off and the instant at which the bipolar voltage pulse is turned on) Td 30–70 $\mu$sec.

The BPSG film was etched under these conditions. The etching speed was drastically improved to 500–800 $\mu$m/sec and good selectivity to silicon of 40 or more was also provided. The etching profile was anisotropic.

In the first to fourth embodiments, the invention is applied to the dry etching systems, but not limited to them. The invention can be applied to various systems requiring high-vacuum plasma, such as plasma CVD, and sputtering.

As we have discussed, the invention produces the following effect:

Since potential difference imbalance in the pattern to be processed can be resolved, the problems involved in the conventional plasma processing methods and systems, such as (1) abnormal etching profile caused by potential difference imbalance, (2) microloading effect, and (3) degradation or breakdown of gate insulating film, can be solved.

What is claimed is:

1. A plasma treatment method comprising the steps of:
   supplying a reactive gas to a vacuum chamber;
   supplying radio frequency power to the vacuum chamber intermittently so as to put the reactive gas into plasma;
   applying a positive pulse-like bias voltage to a specimen placed in the vacuum chamber, the bias voltage being synchronized with a period in which the radio frequency power is not supplied; and
   treating the specimen by the plasma of the reactive gas generated in the vacuum chamber.

2. The plasma treatment method as claimed in claim 1 wherein the pulse-like bias voltage is applied to the specimen via a specimen stage disposed in the vacuum chamber.

3. The plasma treatment method as claimed in claim 1 wherein the pulse-like bias voltage is applied after expiration of a predetermined time interval measured from an end time of a period in which the radio frequency power is supplied.

4. The plasma treatment method as claimed in claim 3 wherein the predetermined time interval ends at a time at which electron density in the vacuum chamber becomes less than a predetermined value.

5. The plasma treatment method as claimed in claim 1 wherein said bias voltage has a negative period synchronized with a period in which the radio frequency power is supplied.

6. A plasma treatment system comprising:
   a vacuum chamber in which a specimen is placed;
   a reactive gas supply to supply a reactive gas to said vacuum chamber;
   a plasma generating power supply to supply radio frequency power to said vacuum chamber intermittently; and
   a bias voltage supply to apply a positive pulse-like bias voltage to the specimen, the bias voltage being synchronized with a period in which the radio frequency power is not supplied and the bias voltage being applied after an expiration of a time interval, the time interval measured from an end time of a period in which the radio frequency power is supplied to a time at which electron density in the vacuum chamber becomes less than a predetermined electron density value.

7. The plasma treatment system as claim in claim 6 wherein said bias voltage supply applies the pulse-like bias voltage to the specimen via a specimen stage disposed in said vacuum chamber.

8. The plasma treatment system as claimed in claim 6 wherein said bias voltage supply has a negative period synchronized with a period in which the radio frequency power is supplied.

9. The plasma treatment system as claimed in claim 4, wherein the predetermined electron density value is an electron density value being less than a half of a peak electron density value.

10. The plasma treatment system as claimed in claim 6, wherein the predetermined electron density value is an electron density value being less than a half of a peak electron density value.

11. The plasma treatment system as claimed in claim 6, further comprising an electron density detector to monitor electron density in the vacuum chamber and connected to regulate the bias voltage supply.

12. A plasma treatment method comprising the steps of:
   supplying a reactive gas to a vacuum chamber;
   supplying radio frequency power to the vacuum chamber while repeating high and low levels alternatively so as to put the reactive gas into plasma;
   applying a positive pulse-like bias voltage to a specimen placed in the vacuum chamber, the bias voltage being synchronized with a period in which low-power is supplied; and
   treating the specimen by the plasma of the reactive gas generated in the vacuum chamber.

13. The plasma treatment method as claimed in claim 12, wherein the pulse-like bias voltage is applied after expiration of a predetermined time interval measured from an end time of a period in which high-level power is supplied.

14. The plasma treatment method as claimed in claim 13, wherein the predetermined time interval ends at a time at which electron density in the vacuum chamber becomes less than a predetermined value.

15. The plasma treatment system as claimed in claim 14, wherein the predetermined electron density value is an electron density value being less than a half of a maximum electron density value.

16. The plasma treatment method as claimed in claim 12, wherein the pulse-like bias voltage is applied to the specimen via a specimen stage disposed in the vacuum chamber.

17. The plasma treatment method as claimed in claim 12, wherein said bias voltage has a negative period synchronized with a period in which the radio frequency power is high.

18. A plasma treatment system comprising:
   a vacuum chamber in which a specimen is placed;
   a reactive gas supply to supply a reactive gas to said vacuum chamber;
   a plasma generating power supply to supply radio frequency power to said vacuum chamber while repeating high and low levels alternately; and
   a bias voltage supply to apply a positive pulse-like bias voltage to the specimen, the bias voltage being synchronized with a period in which low-level power is supplied and the bias voltage being applied after an expiration of a time interval, the time interval measured from an end time of a period in which the radio frequency power is high to a time at which electron density in the vacuum chamber becomes less than a predetermined electron density value.

19. The plasma treatment system as claimed in claim 18, wherein said bias voltage supply applies the pulse-like bias voltage to the specimen via a specimen stage disposed in said vacuum chamber.

20. The plasma treatment system as claimed in claim 18, wherein said bias voltage supply has a negative period synchronized with a period in which the radio frequency power is high.

21. The plasma treatment system as claimed in claim 18, wherein the predetermined electron density value is an electron density value being less than a half of a peak electron density value.

22. The plasma treatment system as claimed in claim 18, further comprising an electron density detector to monitor electron density in the vacuum chamber and connected to regulate the bias voltage supply.

* * * * *

UNITED STATES PATENT AND TRADEMARK OFFICE
CERTIFICATE OF CORRECTION

PATENT NO. : 5,928,528
DATED : July 27, 1999
INVENTOR(S) : Kubota et al.

It is certified that error appears in the above-identified patent and that said Letters Patent is hereby corrected as shown below:

Column 1, Line 16, delete "surface" and insert --surfaces--.

Column 2, Line 36, delete "B78" and insert --E78--.

Column 6, Line 32, delete "density's" and insert --density ≥--.

Column 7, Line 64, delete "(T⸺Td)" and insert --(T≥Td)--.

Column 8, Line 33, delete "density ≧ peak" and insert --density ≥ peak--.

Signed and Sealed this

Eighteenth Day of January, 2000

Attest:

Q. TODD DICKINSON

*Attesting Officer*     *Commissioner of Patents and Trademarks*

UNITED STATES PATENT AND TRADEMARK OFFICE
CERTIFICATE OF CORRECTION

PATENT NO. : 5,928,528
DATED : July 27, 1999
INVENTOR(S) : Kubota, et. al.

It is certified that error appears in the above-identified patent and that said Letters Patent is hereby corrected as shown below:

Column 8, Line 24, delete "(V>VD)" and insert --(V≥VD)--

Column 8, Line 26, delete "(Td-Td+Tδ)" and insert --(Td=Td+Tδ)--

Signed and Sealed this

Fourth Day of April, 2000

Attest:

Attesting Officer

Q. TODD DICKINSON

Director of Patents and Trademarks